(12) United States Patent
Tang et al.

(10) Patent No.: US 11,317,042 B2
(45) Date of Patent: Apr. 26, 2022

(54) IMAGE SENSOR APPARATUS AND PROCESSING CIRCUIT CAPABLE OF PREVENTING SAMPLED RESET/EXPOSURE CHARGES FROM LIGHT ILLUMINATION AS WELL AS ACHIEVING LOWER CIRCUIT COSTS

(71) Applicant: PixArt Imaging Inc., Hsin-Chu (TW)

(72) Inventors: Kuan Tang, Hsin-Chu (TW); Yi-Cheng Chiu, Hsin-Chu (TW); Jui-Te Chiu, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 0 days.

(21) Appl. No.: 17/183,366

(22) Filed: Feb. 24, 2021

(65) Prior Publication Data

US 2022/0070395 A1 Mar. 3, 2022

Related U.S. Application Data

(63) Continuation-in-part of application No. 17/002,755, filed on Aug. 25, 2020.

(51) Int. Cl.
*H04N 5/355* (2011.01)
*H01L 27/146* (2006.01)
*H04N 5/353* (2011.01)

(52) U.S. Cl.
CPC ..... *H04N 5/3559* (2013.01); *H01L 27/14612* (2013.01); *H01L 27/14643* (2013.01); *H04N 5/3532* (2013.01)

(58) Field of Classification Search
None
See application file for complete search history.

(56) References Cited

U.S. PATENT DOCUMENTS

| 7,128,270 | B2* | 10/2006 | Silverbrook | G06F 3/03545 |
| | | | | 235/472.01 |
| 10,002,901 | B1* | 6/2018 | Xu | H01L 27/14603 |
| 2005/0024510 | A1* | 2/2005 | Lapstun | H04N 5/378 |
| | | | | 348/294 |
| 2013/0068929 | A1* | 3/2013 | Solhusvik | H04N 5/345 |
| | | | | 250/208.1 |
| 2014/0139713 | A1* | 5/2014 | Gomi | H04N 5/379 |
| | | | | 348/308 |
| 2019/0288023 | A1* | 9/2019 | Raynor | H04N 5/363 |
| 2020/0112699 | A1* | 4/2020 | Huang | H04N 5/378 |
| 2020/0244900 | A1* | 7/2020 | Hynecek | H01L 27/14612 |
| 2021/0144330 | A1* | 5/2021 | Otaka | H04N 5/379 |

* cited by examiner

*Primary Examiner* — James M Hannett
(74) *Attorney, Agent, or Firm* — Winston Hsu

(57) ABSTRACT

An image sensor apparatus includes a pixel array having pixel units each including an image sensor cell and a processing circuit. The processing circuit includes a bias transistor, second floating diffusion node, first switch unit, signal transfer capacitor, reset transfer capacitor, second switch unit, and third switch unit. Bias transistor is coupled between first and second floating diffusion nodes and has control terminal coupled to bias voltage. First switch unit is coupled between first and second floating diffusion nodes. Second switch unit is coupled between second floating diffusion node and signal transfer capacitor. Third switch unit is coupled between second floating diffusion node and reset transfer capacitor. Signal transfer capacitor is selectively coupled to second floating diffusion node. Reset transfer capacitor is selectively coupled to second floating diffusion node.

16 Claims, 10 Drawing Sheets

IMAGE SENSOR APPARATUS AND PROCESSING CIRCUIT CAPABLE OF PREVENTING SAMPLED RESET/EXPOSURE CHARGES FROM LIGHT ILLUMINATION AS WELL AS ACHIEVING LOWER CIRCUIT COSTS

CROSS REFERENCE TO RELATED APPLICATIONS

This application is a continuation in part application and claims the benefit of U.S. Non-provisional application Ser. No. 17/002,755, which was filed on 2020 Aug. 25 and is included herein by reference.

BACKGROUND OF THE INVENTION

1. Field of the Invention

The invention relates to the architecture of an image sensor, and more particularly to an image sensor apparatus and processing circuit capable of preventing sampled reset/exposure charges from light illumination as well as achieving lower circuit costs.

2. Description of the Prior Art

Generally speaking, a conventional image sensor device may use two separate and different circuit paths to store the reset charge signal and the sensed/sampled pixel signal which are transmitted from each pixel cell unit. More transistor circuits are needed to implement all pixel cell units of a pixel array of the conventional image sensor device.

In addition, the signal distortion will be introduced if the reset charge signal and the sensed/sampled pixel signal are temporarily stored in the pixel cell units which are illuminated by light. Further, if a conventional image sensor device is arranged to directly obtain the reset charge signal and the sensed/sampled pixel signal without temporarily storing the signals, then it needs to use multiple corresponding pixel data readout circuits, respectively corresponding to the pixel cell units, to simultaneously read out the reset charge signal and the sensed/sampled pixel signal when a global shutter operation is employed. The circuit costs are higher.

SUMMARY OF THE INVENTION

Therefore one of the objectives of the invention is to provide a novel image sensor apparatus, to solve the above-mentioned problems.

According to embodiments of the invention, an image sensor apparatus is disclosed. The image sensor apparatus comprises a pixel array which comprises a plurality of pixel units. A pixel unit comprises an image sensor cell and a processing circuit. The image sensor cell comprises a photodiode, a first floating diffusion node, a transfer transistor, and a reset transistor. The transfer transistor is coupled between the photodiode and the first floating diffusion node, and it has a control terminal coupled to a transfer control signal. The reset transistor is coupled between a reset voltage and the first floating diffusion node, and it has a control terminal coupled to a reset control signal. The processing circuit comprises a bias transistor, a second floating diffusion node, a first switch unit, a signal transfer capacitor, a reset transfer capacitor, a second switch unit, and a third switch unit. The bias transistor is coupled between the first floating diffusion node and the first reference level, and it has a control terminal coupled to a bias voltage. The first switch unit is coupled between the first floating diffusion node and the second floating diffusion node. The signal transfer capacitor is coupled to the first reference level. The reset transfer capacitor is coupled to the first reference level. The second switch unit is coupled between the second floating diffusion node and the signal transfer capacitor. The third switch unit is coupled between the second floating diffusion node and the reset transfer capacitor. The signal transfer capacitor is selectively coupled to the second floating diffusion node via the second switch unit, and the reset transfer capacitor is selectively coupled to the second floating diffusion node via the third switch unit.

According to the embodiments, a processing circuit disposed within a pixel unit further having an image sensor cell is disclosed. The processing circuit is coupled to the image sensor cell of the pixel unit in a plurality of pixel units of a pixel array in an image sensor apparatus, and the image sensor cell has a first floating diffusion node which is selectively coupled to a photodiode. The processing circuit comprises a bias transistor, a second floating diffusion node, a first switch unit, a signal transfer capacitor, a reset transfer capacitor, a second switch unit, and a third switch unit. The bias transistor is coupled between the first floating diffusion node and a first reference level, and it has a control terminal coupled to a bias voltage. The first switch unit is coupled between the first floating diffusion node and the second floating diffusion node. The second switch unit is coupled between the second floating diffusion node and the signal transfer capacitor. The third switch unit is coupled between the second floating diffusion node and the reset transfer capacitor. The signal transfer capacitor is selectively coupled to the second floating diffusion node via the second switch unit, and the reset transfer capacitor is selectively coupled to the second floating diffusion node via the third switch unit.

According to the embodiments, the image sensor apparatus is capable of operating under a global shutter mode and a rolling shutter mode. The image sensor cell further comprises a specific row select transistor which has a first terminal coupled to the first floating diffusion node, a second terminal coupled to the pixel unit's output end, and a control terminal coupled to a specific row select control signal of the rolling shutter mode. The specific row select transistor is turned on to be closed according to the row select control signal to make an exposure charge signal or a reset charge signal at the first floating diffusion node be transmitted to the pixel unit's output end through the specific row select transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
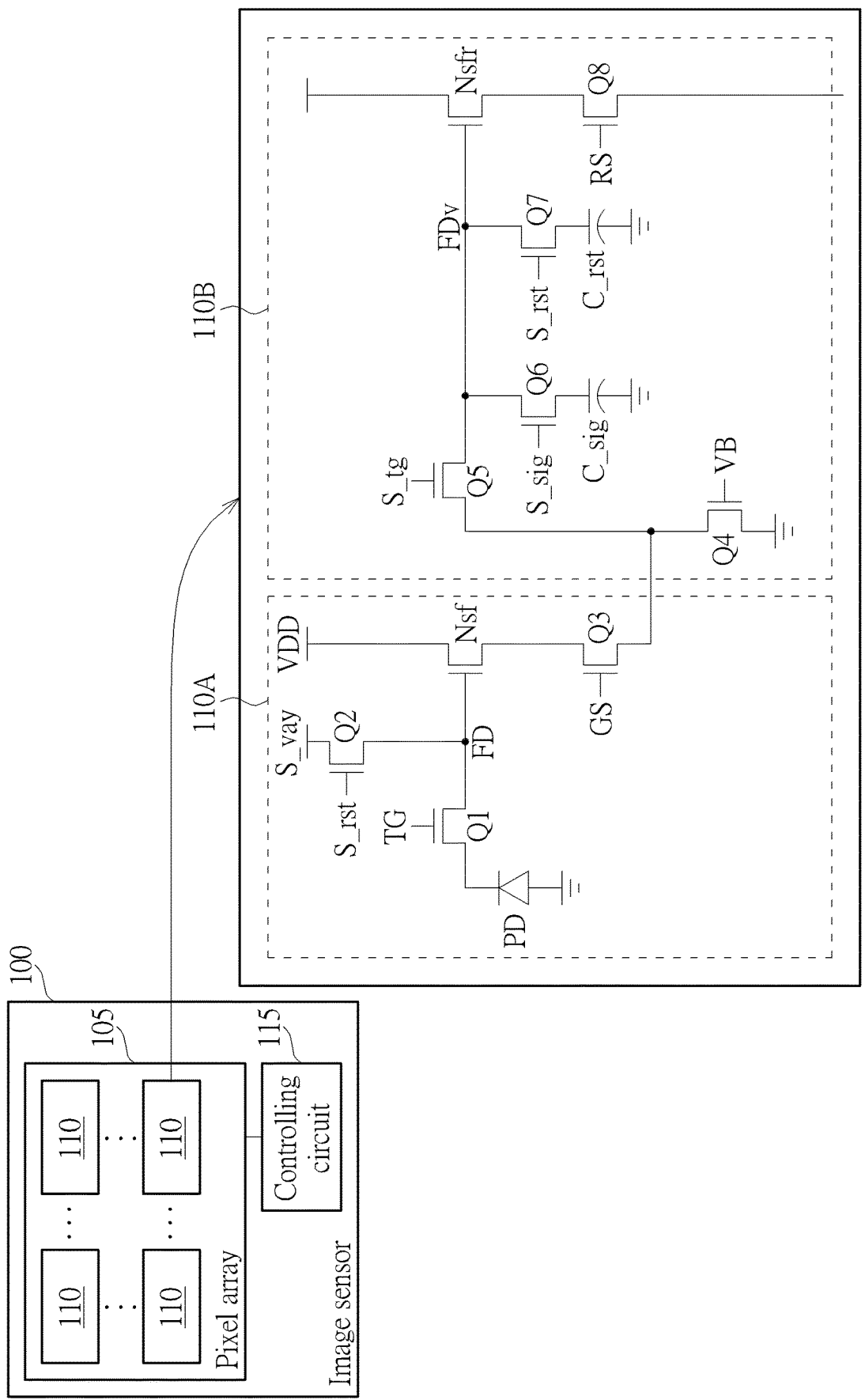
FIG. 1 is a diagram of an image sensor apparatus according to an embodiment of the invention.

FIG. 1 is a diagram of an image sensor apparatus 100 according to an embodiment of the invention. The image sensor apparatus 100 comprises a pixel array 105 which comprises a plurality of pixel units 110 such as N×M pixel units wherein N and M are identical/different integers. One or each pixel unit 110 comprises an image sensor cell (or pixel cell) 110A and a processing circuit 110B; that is, the image sensor apparatus 100 comprises N×M image sensor cells 110A and N× M processing circuits 110B. The image sensor apparatus 100 further comprises a controlling circuit 115 which is used for generating control signal(s) and voltage(s) to control the operation of each pixel unit 110 so as to read out sampled exposure charge signal and reset charge signal to calculate a corresponding pixel value.

The image sensor cell 110A comprises a photodiode PD, a first floating diffusion node FD, a transfer transistor Q1, a reset transistor Q2, and transistors Nsf and Q3. The processing circuit 110B comprises a bias transistor Q4, a second floating diffusion node FDv, a first switch unit (implemented by using a transistor Q5; but not limited), a signal transfer capacitor C_sig (e.g. a signal storage capacitor which can be implemented by a transistor), a reset transfer capacitor C_rst (e.g. a reset storage capacitor which can be implemented by a transistor), a second switch unit (implemented by using a transistor Q6), a third switch unit (implemented by using a transistor Q7), and transistors Nsfr and Q8. The transistor Q8 is a row select transistor coupled to a bit line of the pixel unit 110, and the bit line of a pixel unit 110 means an output end of the pixel unit 110 for outputting the reset/exposure charge signal to a readout circuit such as a correlated double sampling (CDS) circuit in the controlling circuit 115.

For the control signals and voltages, the signal VB is a bias voltage signal which can be generated by the controlling circuit 115 or by other circuit(s), and the control signals/voltages TG, S_rst, GS, S_tg, S_sig, S_rst, and RS are generated and outputted by the controlling circuit 115 which is used to control the exposure operation of a global shutter mode/mechanism so as to control a global shutter turn-on period.

In practice, the control signal GS is shifted to a high level when the exposure operation of the global shutter mode starts and is shifted to a low level when such exposure operation ends. That is, the transistor Q3 is turned on by the control signal GS during the global shutter turn-on period, and it is turned off by the control signal GS out of the global shutter turn-on period.

The transfer transistor Q1 is coupled between the photodiode PD and the first floating diffusion node FD and has a control terminal (e.g. gate) coupled to the transfer control signal TG. The reset transistor Q2 is coupled between the reset voltage S_vay and the first floating diffusion node FD and has a control terminal (e.g. gate) coupled to the reset control signal S_rst. The transistor Nsf is coupled between an end of the transistor Q3 and a second reference level such as a supply level VDD, and has a control terminal (i.e. gate) coupled to the voltage at the first floating diffusion node FD. The transistor Nsf for example is a source-follower transistor in which the voltage at the source of transistor Nsf follows the voltage at the gate of transistor Nsf (i.e. the voltage at the first floating diffusion node FD).

In this embodiment, the correlated double sampling (CDS) operation is employed by the image sensor apparatus 100 to cancel temporal noise of the detected pixel values wherein for each pixel unit 110 the CDS operation is arranged to measure or sample the pixel output voltage of the each pixel unit 110 twice to respectively generate a reset charge signal corresponding to the reset voltage) during a pixel reset interval of the global shutter turn-on period (i.e. when the pixel unit 110 is at a reset state) and generate an exposure charge signal corresponding to the exposure voltage during a pixel sample interval of the global shutter turn-on period (i.e. when the pixel unit 110 is at a readout state), so that the CDS operation can use the reset charge signal and the exposure charge signal to accurately calculate and generate a pixel value of the pixel unit 110 for a frame.

The transfer transistor Q1 is used to transfer charge from the reset voltage S_vay to the photodiode PD during the pixel reset interval, and is used to transfer charge from the photodiode PD to the first floating diffusion node FD during the pixel sample interval. That is, during the pixel reset interval, the signal TG is shifted to the high level and the signal S_rst is shifted to the high level (i.e. the transistor Q2 is turned on by the signal S_rst), the photodiode PD is reset. In this situation, the voltage/charge at the first floating diffusion node FD is the reset charge signal, and then it is transmitted through the source-follower transistor Nsf and the transistor Q3 (which is turned on by the control signal GS) and then is transmitted to the processing circuit 110B.

For the processing circuit 110B of each pixel unit 110, the bias transistor Q4 is coupled between the first floating diffusion node FD and the first reference level such as the ground level and has a control terminal (e.g. gate) coupled to the bias voltage VB. The first switch unit Q5 is coupled between the first floating diffusion node FD and the second floating diffusion node FDv. The signal transfer capacitor C_sig is coupled to the first reference level such as the ground level. The reset transfer capacitor C_rst is coupled to the first reference level such as the ground level. The second switch unit Q6 is coupled between the second floating diffusion node FDv and the signal transfer capacitor C_sig. The third switch unit Q7 is coupled between the second floating diffusion node FDv and the reset transfer capacitor C_rst.

When the reset charge signal is transmitted from the image sensor cell 110A to the processing circuit 110B, the first switch unit Q5 is turned on by the control signal S_tg (i.e. the first switch unit becomes closed), the second switch unit Q6 is turned off by the control signal S_sig (i.e. the second switch unit becomes open), and the third switch unit Q7 is turned on by the control signal S_rst (i.e. the third switch unit becomes closed). Accordingly, the reset charge signal at the first floating diffusion FD can be stored into the reset transfer capacitor C_rst via the source-follower transistor Nsf, transistor Q3, transistor Q5, and transistor Q7. Then, when the first switch unit Q5 is turned off by the control signal S_tg, the second switch unit Q6 is turned off by the control signal S_sig, the third switch unit Q7 is turned on by the control signal S_rst, and the transistor Q8 is turned on by the row select control signal RS, such reset charge signal stored by the reset transfer capacitor C_rst is transferred to the second floating diffusion node FDv (i.e. a charge signal at the second floating diffusion node FDv) and then transmitted to the bit line via the source-follower transistor Nsfr and the transistor Q8 so that the reset charge signal is read out.

Similarly, during the pixel sample interval, when the control signal TG is shifted to the high level and the control signal S_rst is shifted to the low level (i.e. the reset transistor Q2 is turned off by the control signal S_rst), the charge on the photodiode PD is transferred into the first floating diffusion node FD. In this situation, the voltage/charge at the first floating diffusion node FD is an exposure charge signal, and it is then transmitted through the source-follower transistor Nsf and the transistor Q3 (which is turned on by the control signal GS) and then is transmitted to the processing circuit 110B. When the sensed/sampled exposure charge signal is transmitted from the image sensor cell 110A to the processing circuit 110B, the first switch unit Q5 is turned on by the control signal S_tg (i.e. the first switch unit becomes closed), the second switch unit Q6 is turned on by the control signal S_sig (i.e. the second switch unit becomes closed), and the third switch unit Q7 is turned off by the control signal S_rst (i.e. the third switch unit becomes open). Accordingly, the sensed/sampled exposure charge signal at the first floating diffusion FD can be stored into the signal transfer capacitor C_sig via the source-follower transistor Nsf, transistor Q3, transistor Q5, and transistor Q6. Then, when the first switch unit Q5 is turned off by the control signal S_tg, the second switch unit Q6 is turned on by the control signal S_sig, the third switch unit Q7 is turned off by the control signal S_rst, and the transistor Q8 is turned on by the row select control signal RS again, such sensed/sampled exposure charge signal stored by the signal transfer capacitor C_sig is transferred to the second floating diffusion node FDv (i.e. another charge signal at the second floating diffusion node FDv) and then transmitted to the bit line via the source-follower transistor Nsfr and the transistor Q8 so that the sensed/sampled exposure charge signal is read out. Accordingly, based on the above operations, the CDS operation can obtain the reset charge signal and the sensed/sampled exposure charge signal to accurately generate and calculate a pixel value of the pixel unit 110 for a frame.

It should be noted that the first switch unit Q5 is used as a main switch unit which can respectively transfer the reset charge signal and the sensed/sampled exposure charge signal from the image sensor cell 110A to the second floating diffusion node FDv at different times. A conventional image sensor device may use two separate and different circuit paths to store the reset charge signal and the sensed/sampled exposure charge signal which are transmitted from a pixel cell. More transistor circuits are needed to implement the conventional image sensor device. Compared to the conventional image sensor, the first switch unit Q5 is used as the main switch unit and either second switch unit Q6 or third switch unit Q7 is used as an auxiliary switch unit to respectively store the reset charge signal and the sensed/sampled exposure charge signal which are transmitted from the image sensor cell 110A at different times. Therefore, the circuit costs can be significantly decreased when the circuit structure of the processing circuit 110B is applied into all the pixel circuits.

Figure 2:
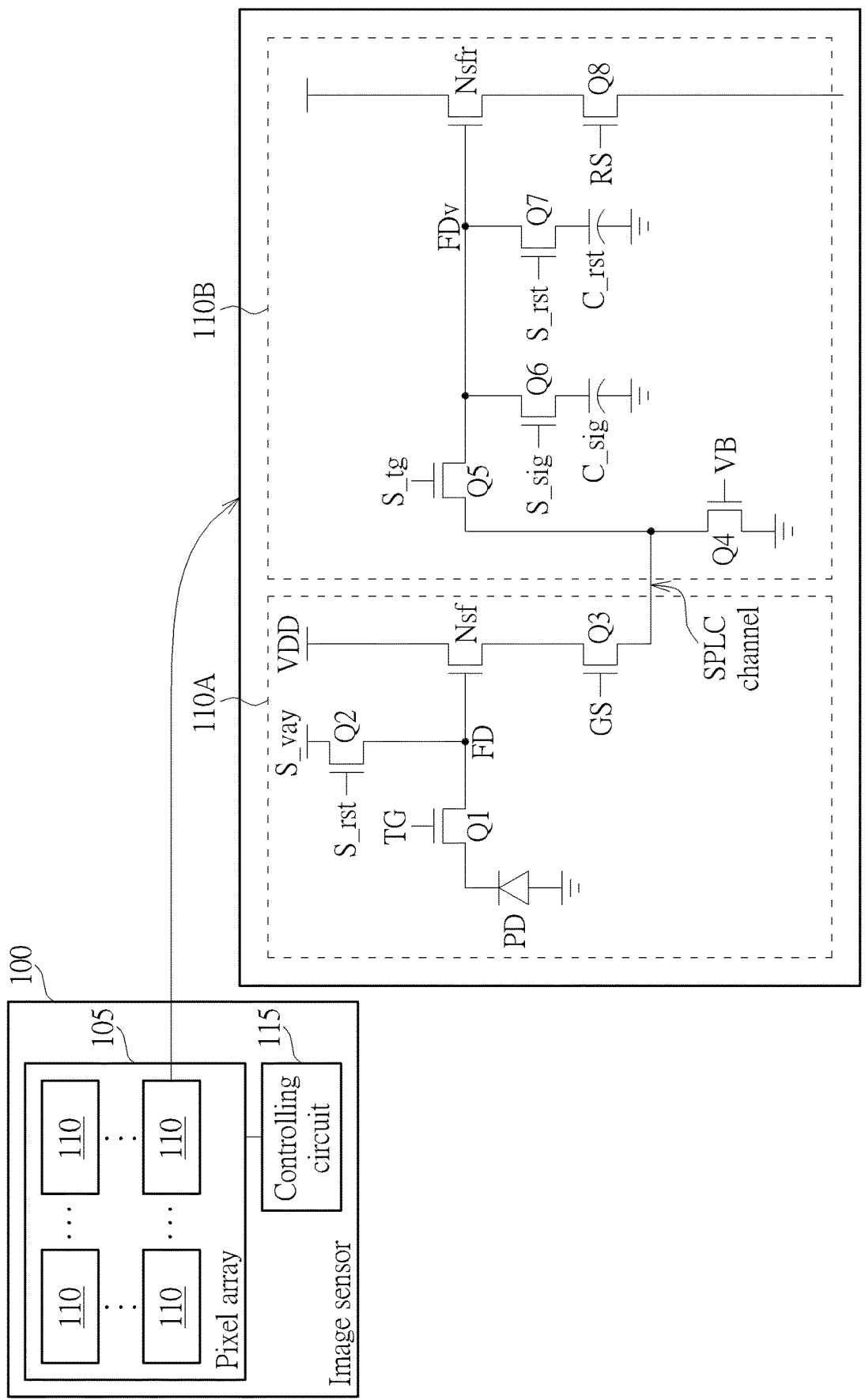
FIG. 2 is a diagram of the image sensor apparatus according to another embodiment of the invention.
Figure 3:
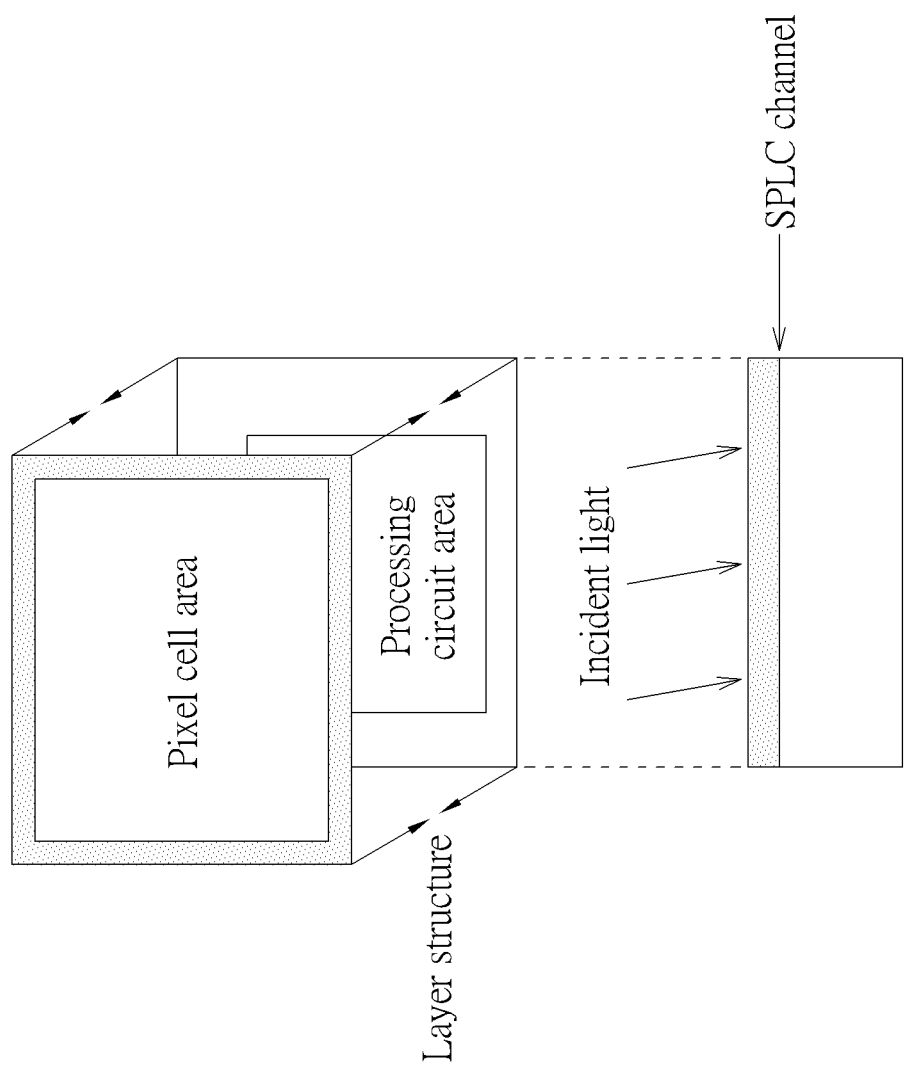
FIG. 3 is a diagram showing the layers of the BSI circuit structure of the image sensor apparatus according to the embodiment of FIG. 2.

Further, in other embodiments, the image sensor apparatus 100 can be implemented as a backside illumination sensor (BSI). Refer to FIG. 2 in conjunction with FIG. 3. FIG. 2 is a diagram of the image sensor apparatus 100 according to another embodiment of the invention. FIG. 3 is a diagram showing the layers of the BSI circuit structure of the image sensor apparatus 100 according to the embodiment of FIG. 2. As shown in FIG. 2, for each pixel unit 110, the image sensor cell 110A is coupled to the processing circuit 110B via a stacked pixel level connection (SPLC) channel wherein the processing circuit 110B is an application specific integrated circuit (ASIC). As shown in FIG. 3, all the image sensor cells 110A are disposed at the pixel cell area of the top layer, and all corresponding processing circuits 110B are disposed at the processing circuit area of the bottom layer; the image sensor cells 110A are respectively coupled to the processing circuits 110B via respective stacked pixel level connection channels. Based on the BSI circuit structures of FIG. 2 and FIG. 3, since no reset/exposure charge signals are stored by the image sensor cells 110A at the top layer and the processing circuits 110B at the bottom layer are not illuminated by incident light, the reset charge signals and the sampled exposure charge signals respectively stored by capacitors of the processing circuits 110B are not affected by incident light (or environment light) so that the pixel values calculated by the CDS operation are more accurate and no signal distortions are introduced. Further, one embodiment of the invention uses the circuit design of only two floating diffusion nodes FD and FDv for each pixel unit in which the exposure charge and/or reset charge signals at the first floating diffusion node FD can be immediately transferred or transmitted from the image sensor cell 110A (e.g. at a layer illuminated by light) to the second floating diffusion node FDv within the processing circuit 110B (e.g. at another layer which is not illuminated by light).

Figure 4:
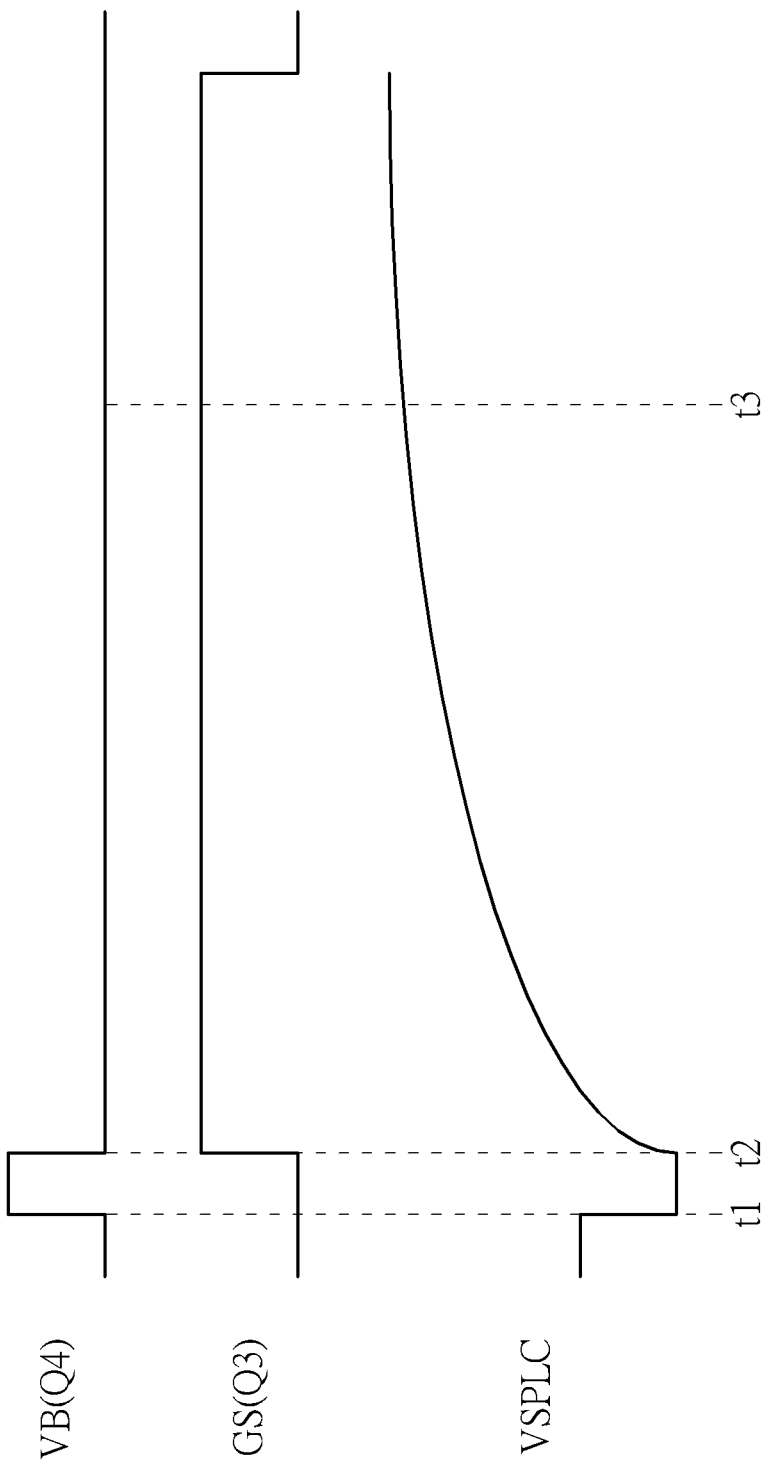
FIG. 4 is a diagram of an example showing the voltage waveforms of the bias voltage signal VB, control signal GS, and the voltage level VSPLC in the SPLC channel according to the embodiment of FIG. 2.

In the embodiments, the transistor Q4 in this embodiment is used as a bias transistor and also can be used as a reset switch. FIG. 4 is a diagram of an example showing the voltage waveforms of the bias voltage signal VB, control signal GS, and the voltage level VSPLC in the SPLC channel (from one end of the transistor Q3 to one end of the transistor Q5, or equivalently from the floating diffusion node FD to the floating diffusion node FDv). As shown in FIG. 4, at time t1, the level of bias voltage signal VB for example is shifted to a high voltage level from a low voltage level such as ground level to instantaneously/fast clear/reset the electrical charge temporally stored or existed in the SPLC channel. For example, when the transistor Q4 is turned on and become conductive due to the high voltage level of bias voltage signal VB, the voltage level VSPLC in the SPLC channel is instantly shifted from a higher voltage level to a lower voltage level such as substantially zero voltage (ground level) and thus the residual electrical charge temporally stored or existed in the SPLC channel can be instantly cleared. Then, for example, at time t2, the level of bias voltage signal VB is shifted to the low voltage level to turn off the transistor Q4, and the level of control signal GS is shifted from a low voltage/logic level to a high voltage/logic level to turn on the transistor Q3. Accordingly, in this situation, signal(s) at the first floating diffusion node FD can be transmitted or transferred via the SPLC channel to the transistor Q5 (or second floating diffusion node FDv). For example (but not limited), the voltage level VSPLC in the SPLC channel may be gradually increased to a voltage level correlated with a signal voltage at the first floating diffusion node FD. For example (but not limited), the voltage level VSPLC in the SPLC channel at time t3 may be higher than the level of the above-mentioned residual electrical charge temporally stored or existed in the SPLC channel before time t1.

According to the embodiments, the multiple ASIC 110B are disposed in the pixel units 110, so the respective reset charge signals and sampled exposure charge signals can be respectively temporarily stored in the pixel units 110. For the controlling circuit 115, only one readout circuit is needed. For example, the controlling circuit 115 may comprise only one set of CDS circuit to sequentially read out the temporarily stored reset charge signals and sampled exposure charge signals since the reset charge signals and sampled exposure charge signals can be temporarily stored in the pixel units and are not affected by incident light.

In other embodiments, in addition to the global shutter mode/mechanism, the above-mentioned image sensor apparatus can further employ a rolling shutter mode/mechanism and is capable of operating under the global shutter mode and the rolling shutter mode respectively to sense pixel values and read out the sensed pixel values in different ways.

Figure 5:
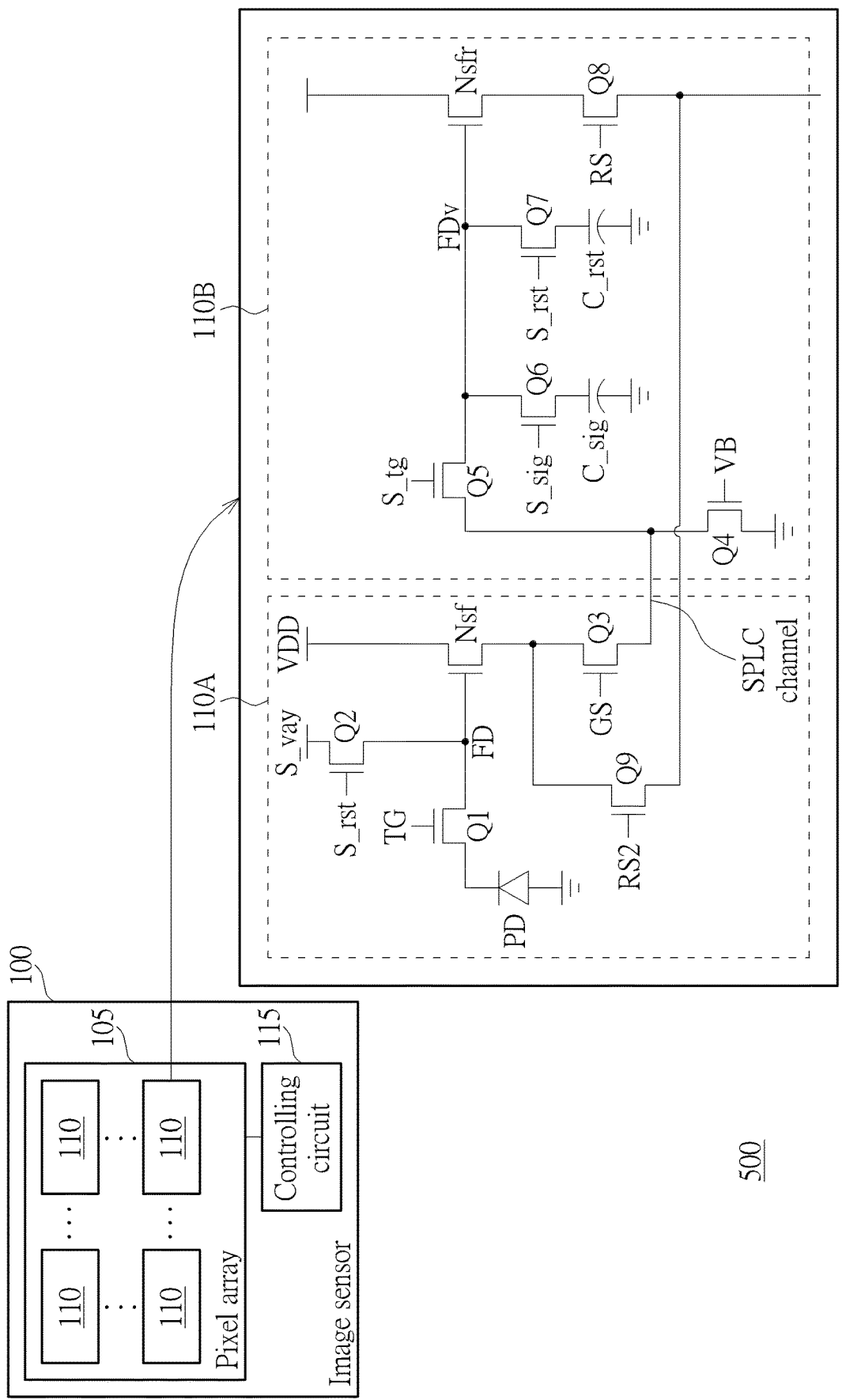
FIG. 5 is a diagram of an image sensor apparatus according to an embodiment of the invention.

FIG. 5 is a diagram of an image sensor apparatus 500 according to an embodiment of the invention. The image sensor apparatus 500 comprises all circuit components and associated functions in the image sensor apparatus 100 of FIG. 1 (or FIG. 2) and further comprises a row select transistor Q9 which is configured within the image sensor cell 110A of FIG. 5, and the transistor Q9 has a first terminal coupled to the source-follower transistor Nsf, a second terminal coupled to the terminal of transistor Q8, and a control terminal coupled to a corresponding control signal RS2 of the rolling shutter mode.

When the image sensor apparatus 500 operates under the global shutter mode, the operations and functions of the pixel units 110 and the controlling circuit 115 disposed in the image sensor apparatus 500 are identical to those of the pixel units and the controlling circuit 115 disposed in the image sensor apparatus 100 operating under the global shutter mode, and the operations and functions are not detailed for brevity.

When the image sensor apparatus 500 operates under the rolling shutter mode, the image sensor apparatus 500 is arranged to sequentially sense, scan, and readout corresponding exposure charge signals and reset charge signals for pixel units disposed on each different row. For each of pixel units 110 disposed or arranged in a specific row (i.e. the same row), the controlling circuit 115 generate a corresponding second control signal RS2 (i.e. a second row select signal) respectively to the transistors Q9 of the pixel units 110 disposed or arranged in the specific row. In practice, the corresponding second row select control signal RS2 is shifted to a low level when to turnoff the transistor Q9 of such pixel unit during a frame-to-frame non-exposure time period (i.e. a non-exposure time period between two frames) and during an exposure time period of a frame. The second row select control signal RS2 is shifted to a high level to turn on the transistor Q9 during an exposure charge readout time period of the specific row and during a reset charge readout time period of the specific row. That is, the transistor Q9 is turned off by the second row select control signal RS2 when the exposure/reset charge signal is not read out from the image sensor cell 110A. When it is determined to read out the exposure/reset charge signal from the image sensor cell 110A, the transistor Q9 is turned on.

Figure 6:
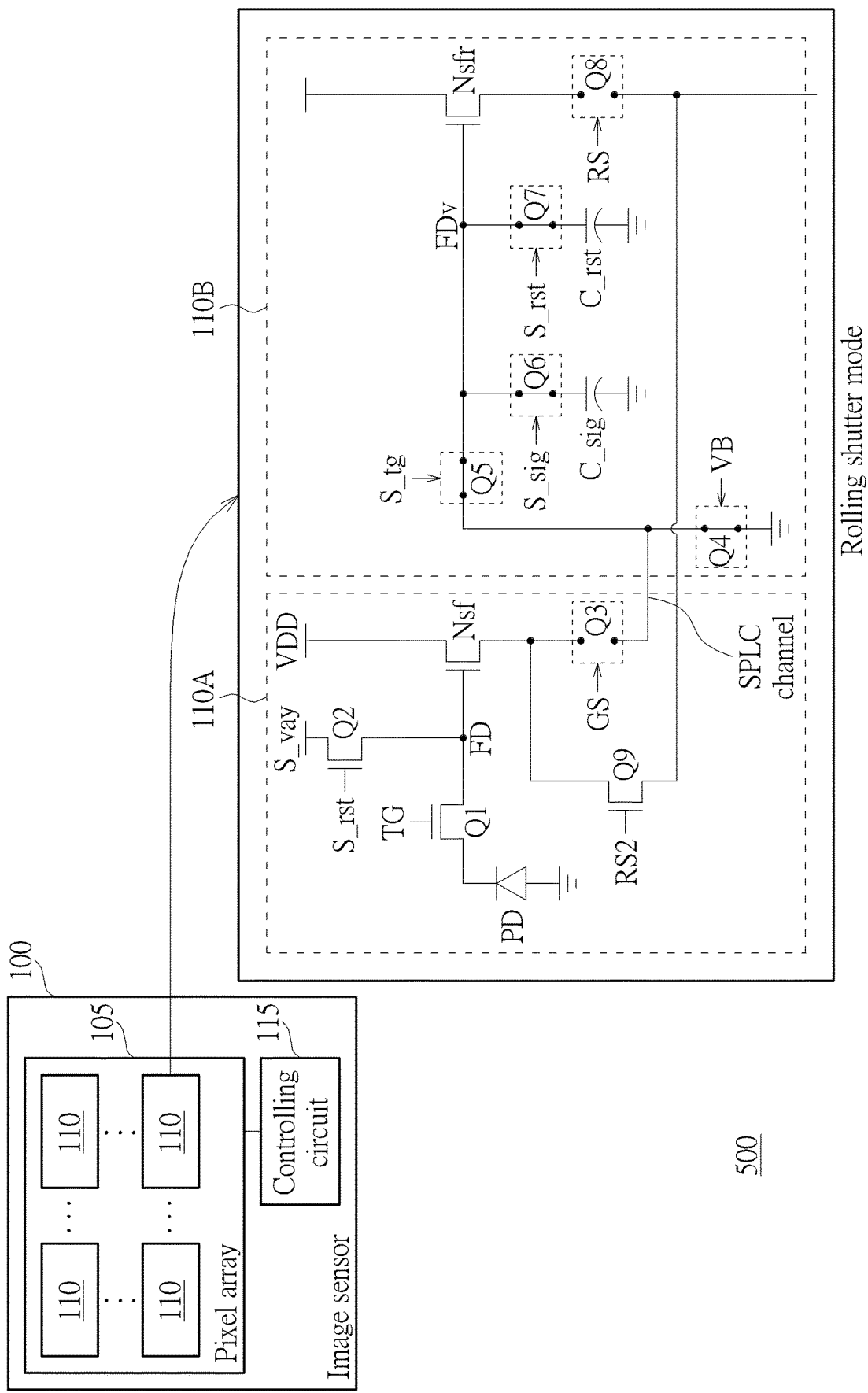
FIG. 6 is a diagram of the circuit operation of the image sensor apparatus when operating under the rolling shutter mode according to an embodiment of the invention.

Refer to FIG. 6. FIG. 6 is a diagram of the circuit operation of the image sensor apparatus 500 when operating under the rolling shutter mode according to an embodiment of the invention. As shown in FIG. 6, when the image sensor apparatus 500 operates under the rolling shutter mode, the controlling circuit 115 generates and outputs the control signal GS with a low level, the control signal S_tg with a high level, the control signal S_sig with a high level, the control signal S_rst with a high level, the first row select control signal RS with a low level, to respectively turn off the transistor Q3 (i.e. open state), turn on the transistors Q5, Q6, and Q7 (i.e. closed state), and turn off the transistor Q8 (i.e. open state). The transistor Q4 is also turned on and biased by the bias voltage bias voltage signal VB. By doing so, the charge at the capacitor C_sig and the charge at the capacitor C_rst can be discharged to the ground level through the transistors Q4-Q7, to reduce the residual charges of the global shutter mode. It should be noted that, the transistors Q5-Q7 may be turned on during the rolling shutter mode in other embodiments.

Figure 7:
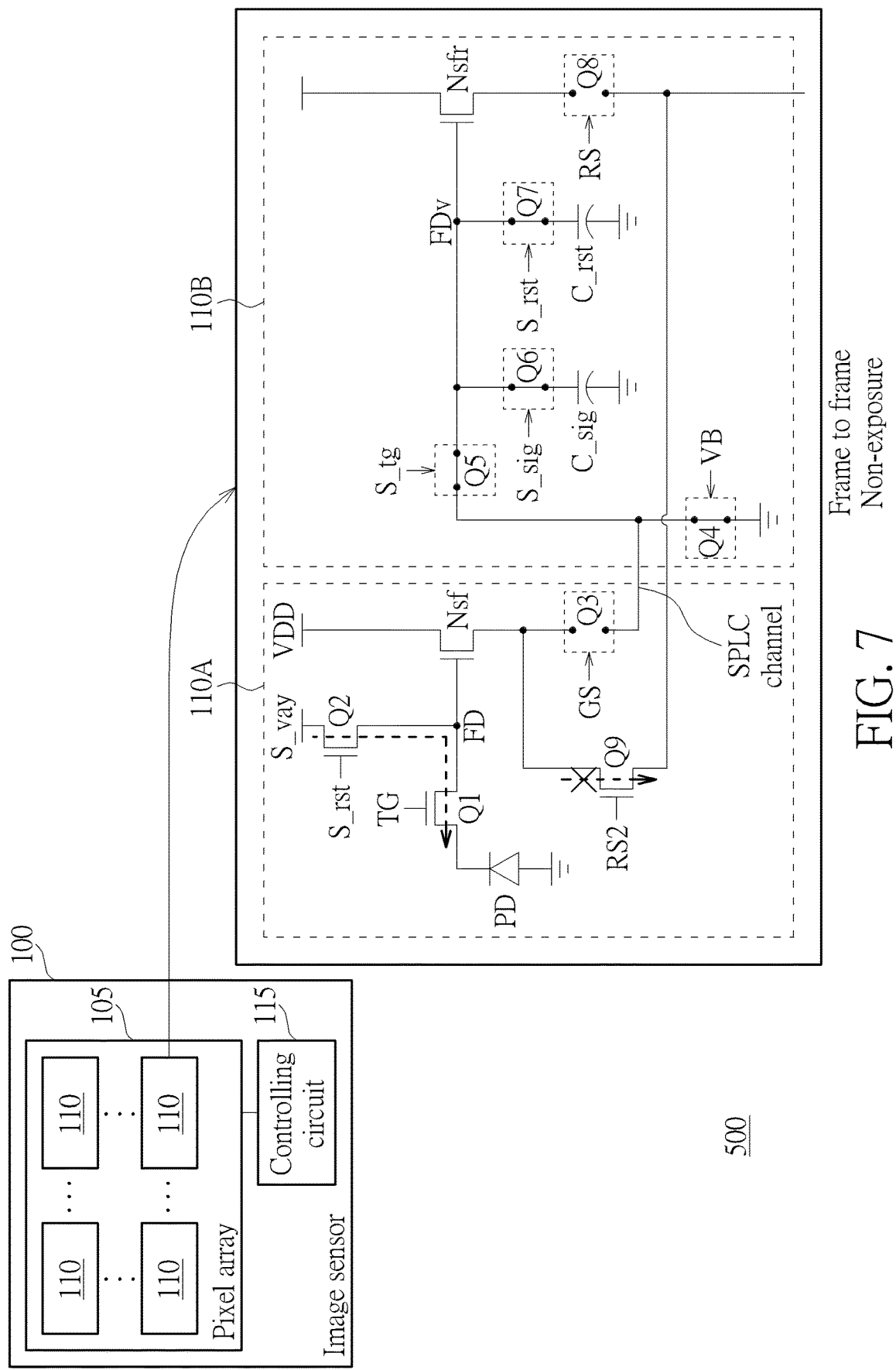
FIG. 7 is a diagram of the circuit operation of the image sensor apparatus during a frame-to-frame non-exposure time period according to the embodiment of FIG. 6.

FIG. 7 is a diagram of the circuit operation of the image sensor apparatus 500 during a frame-to-frame non-exposure time period according to the embodiment of FIG. 6. As shown in FIG. 7, during the frame-to-frame non-exposure time period such as a pixel reset interval, the second row select control signal RS2, generated by the controlling circuit 115, is for example shifted to the low level and thus the transistor Q9 is turned off to become open as shown in FIG. 7. In addition, the control signals TG and S_rst, generated by the controlling circuit 115, are respectively used to turn on the transistors Q1 and Q2, as shown in FIG. 7, and accordingly the photodiode PD is reset.

Figure 8:
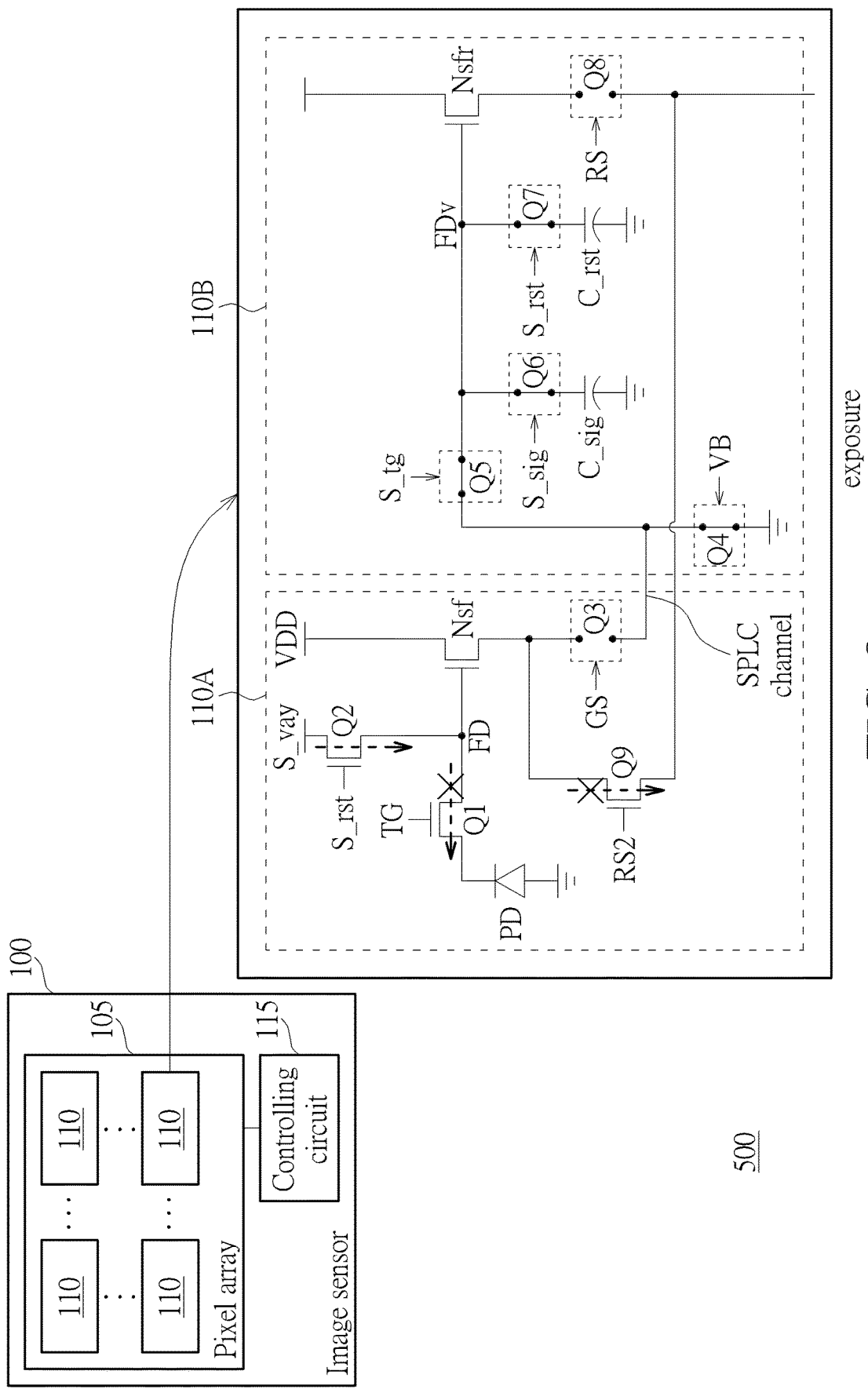
FIG. 8 is a diagram of the circuit operation of the image sensor apparatus during an exposure time period of the rolling shutter mode according to the embodiment of FIG. 6.

FIG. 8 is a diagram of the circuit operation of the image sensor apparatus 500 during an exposure time period of the rolling shutter mode according to the embodiment of FIG. 6. As shown in FIG. 8, during the exposure time period such as a rolling shutter turn-on interval, the second row select control signal RS2, generated by the controlling circuit 115, is for example shifted to or kept at the low level and thus the transistor Q9 is at the open state as shown in FIG. 8. The control signal TG is used to turn off the transistor Q1, and the control signal S_rst is used to turn on the transistor Q2. Thus, the photodiode PD can generate current when exposed to light during the exposure time period.

Figure 9:
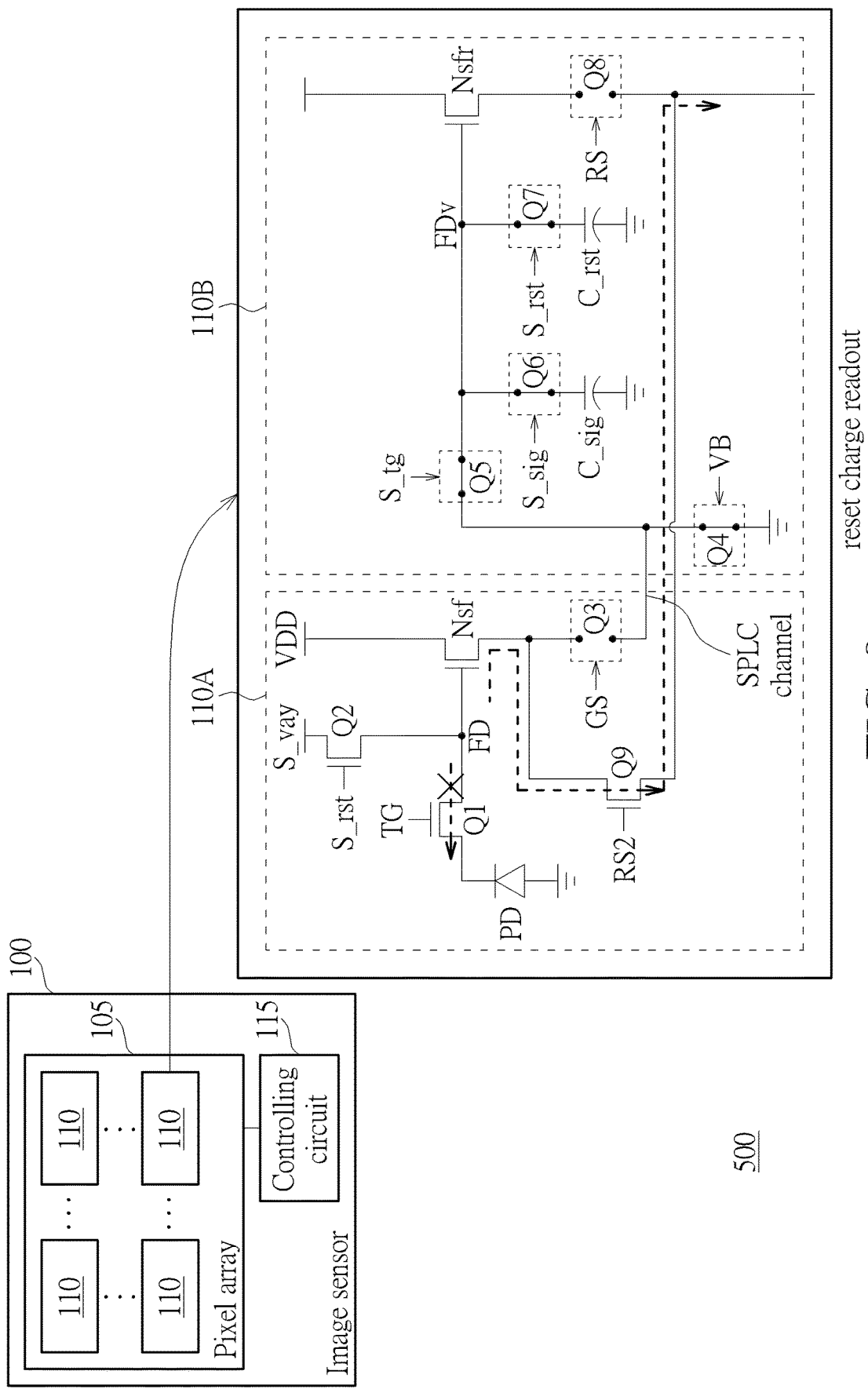
FIG. 9 is a diagram of the circuit operation of the image sensor apparatus during a reset charge readout time period of the rolling shutter mode according to the embodiment of FIG. 6.

FIG. 9 is a diagram of the circuit operation of the image sensor apparatus 500 during a reset charge readout time period of the rolling shutter mode according to the embodiment of FIG. 6. As shown in FIG. 9, during the reset charge readout time period, the second row select control signal RS2, generated by the controlling circuit 115, is for example shifted to or kept at the high level and thus the transistor Q9 is at the closed state. The control signal TG is used to turn off the transistor Q1. To sense, sample and read out the reset charge signal, the control signal S_rst is used to turn on the transistor Q2 at first and then is arranged to turn off the transistor Q2, and thus the reset charge signal can be sampled, transmitted, and read out through the transistors Nsf and Q9 (as indicated by the dotted arrow in FIG. 9) from the floating diffusion node FD to the bit line.

Figure 10:
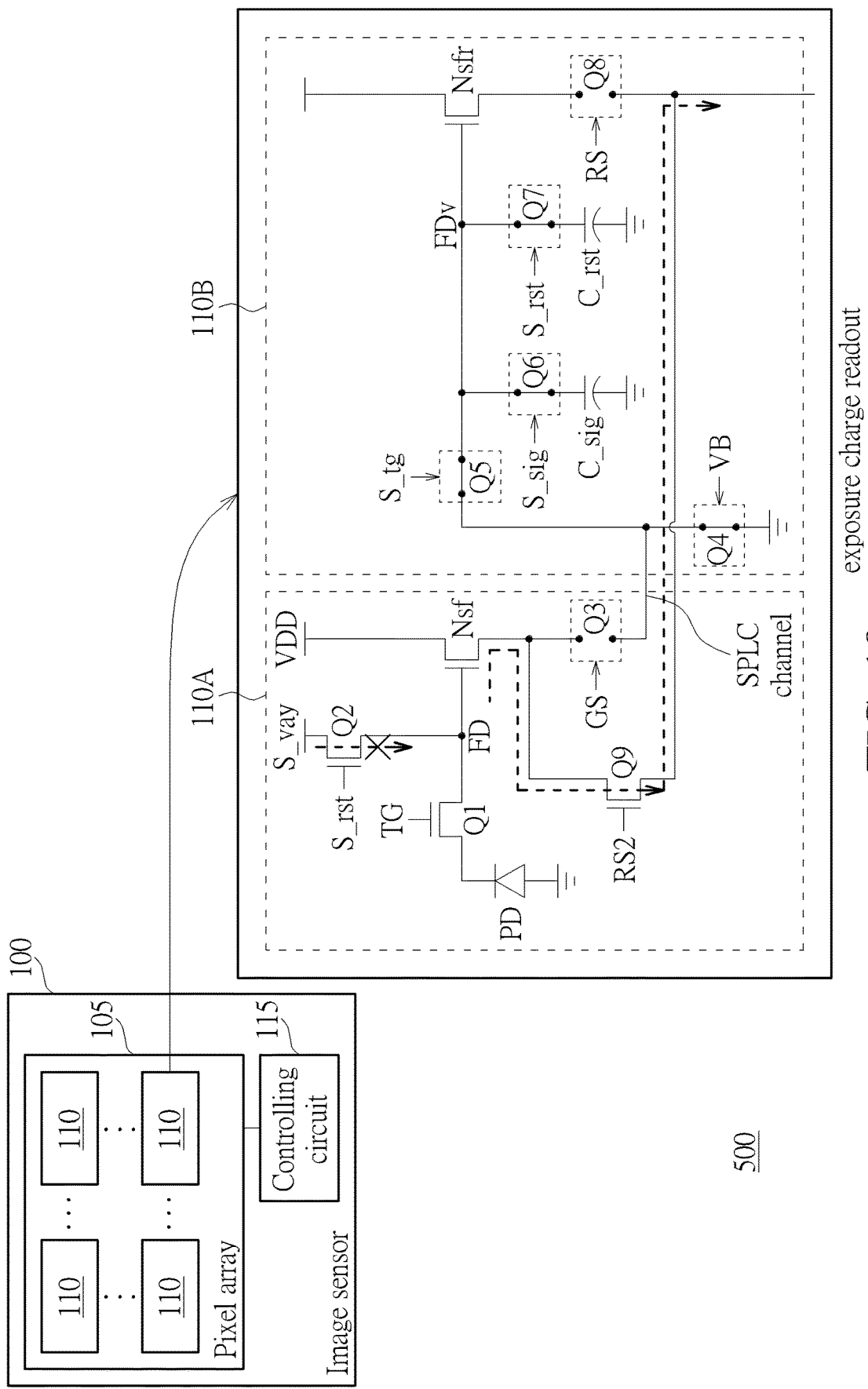
FIG. 10 is a diagram of the circuit operation of the image sensor apparatus during an exposure charge readout time period of the rolling shutter mode according to the embodiment of FIG. 6.

FIG. 10 is a diagram of the circuit operation of the image sensor apparatus 500 during an exposure charge readout time period of the rolling shutter mode according to the embodiment of FIG. 6. As shown in FIG. 10, during the exposure charge readout time period, the second row select control signal RS2, generated by the controlling circuit 115, is for example shifted to or kept at the high level and thus the transistor Q9 is at the closed state. The control signal S_rst is used to turn off the transistor Q2. To sense, sample and read out the exposure charge signal, the control signal TG is used to turn on the transistor Q1 at first and then is arranged to turn off the transistor Q1, and thus the exposure charge signal can be sampled, transmitted, and read out through the transistors Nsf and Q9 (as indicated by the dotted arrow in FIG. 9) from the floating diffusion node FD to the bit line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor apparatus capable of operating under a global shutter mode and a rolling shutter mode, comprising:
   a pixel array comprising a plurality of pixel units, a pixel unit comprising:
      an image sensor cell, comprising:
         a photodiode;
         a first floating diffusion node;
         a transfer transistor, coupled between the photodiode and the first floating diffusion node, having a control terminal coupled to a transfer control signal;
         a reset transistor, coupled between a reset voltage and the first floating diffusion node, having a control terminal coupled to a reset control signal; and
         a specific row select transistor, having a first terminal coupled to the first floating diffusion node, a second terminal coupled to an output end of a processing circuit of the pixel unit, and a control terminal coupled to a specific row select control signal of the rolling shutter mode to dynamically turn on/off the specific row select transistor when the image sensor apparatus operates under the rolling shutter mode and not coupled to the specific row select control signal of the specific row select transistor when the image sensor apparatus operates under the global shutter mode; and
      the processing circuit, comprising:
         a bias transistor, coupled between the first floating diffusion node and a first reference level, having a control terminal coupled to a bias voltage;
         a second floating diffusion node;
         a first switch unit, coupled between the first floating diffusion node and the second floating diffusion node;
         a signal transfer capacitor, coupled to the first reference level;
         a reset transfer capacitor, coupled to the first reference level;
         a second switch unit, coupled between the second floating diffusion node and the signal transfer capacitor; and
         a third switch unit, coupled between the second floating diffusion node and the reset transfer capacitor;
         wherein when the image sensor apparatus operated under the global shutter mode, the signal transfer capacitor is selectively coupled to the second floating diffusion node via the second switch unit, and the reset transfer capacitor is selectively coupled to the second floating diffusion node via the third switch unit.

2. The image sensor apparatus of claim 1, wherein when the image sensor apparatus operated under the global shutter mode, a reset charge signal at the first floating diffusion node is stored into the reset transfer capacitor when the first switch unit is closed, the second switch unit is open, and the third switch unit is closed.

3. The image sensor apparatus of claim 2, wherein the reset charge signal stored by the reset transfer capacitor is transferred to the second floating diffusion node when the first switch unit is open, the second switch unit is open, and the third switch unit is closed.

4. The image sensor apparatus of claim 1, wherein when the image sensor apparatus operated under the global shutter mode, an exposure charge signal at the first floating diffusion node is stored into the signal transfer capacitor when the first switch unit is closed, the second switch unit is closed, and the third switch unit is open.

5. The image sensor apparatus of claim 4, wherein the exposure charge signal stored by the signal transfer capacitor is transferred to the second floating diffusion node when the first switch unit is open, the second switch unit is closed, and the third switch unit is open.

6. The image sensor apparatus of claim 1, wherein the image sensor cell is coupled to the processing circuit via a stacked pixel level connection channel; when the image sensor apparatus operated under the global shutter mode and the bias transistor is turned on and become conductive, the bias transistor is used to clear or reset a residual voltage level in the stacked pixel level connection channel; and, when the image sensor apparatus operated under the global shutter mode and the bias transistor is turned off, at least one charge signal at the first floating diffusion node is transmitted via the stacked pixel level connection channel to the second floating diffusion node.

7. The image sensor apparatus of claim 1, wherein when the image sensor apparatus operates under the rolling shutter mode, the first switch unit is closed, the second switch unit is closed, and the third switch unit is closed, to make charges at the signal transfer capacitor and reset transfer capacitor be discharged to a ground level through the bias transistor.

8. The image sensor apparatus of claim 1, wherein when the image sensor apparatus determines to read out a reset/exposure charge signal from the image sensor cell, the specific row select transistor is turned on to be closed according to the row select control signal to make an exposure charge signal or a reset charge signal at the first floating diffusion node be transmitted to the pixel unit's output end through the specific row select transistor.

9. A processing circuit disposed within a pixel unit further having an image sensor cell, the processing circuit being coupled to the image sensor cell of the pixel unit in a plurality of pixel units of a pixel array in an image sensor apparatus capable of operating under a global shutter mode and a rolling shutter mode, the image sensor cell having a specific row select transistor and a first floating diffusion node which is selectively coupled to a photodiode, the specific row select transistor being turned on when the image sensor apparatus operates under the rolling shutter mode, and the processing circuit comprises:
   a bias transistor, coupled between the first floating diffusion node and a first reference level, having a control terminal coupled to a bias voltage;
   a second floating diffusion node;

a first switch unit, coupled between the first floating diffusion node and the second floating diffusion node;
a signal transfer capacitor, coupled to the first reference level;
a reset transfer capacitor, coupled to the first reference level;
a second switch unit, coupled between the second floating diffusion node and the signal transfer capacitor; and
a third switch unit, coupled between the second floating diffusion node and the reset transfer capacitor;
wherein the signal transfer capacitor is selectively coupled to the second floating diffusion node via the second switch unit, and the reset transfer capacitor is selectively coupled to the second floating diffusion node via the third switch unit; and, when the image sensor apparatus operates under the rolling shutter mode, the first switch unit is closed, the second switch unit is closed, and the third switch unit is closed, to make charges at the signal transfer capacitor and reset transfer capacitor be discharged to a ground level through the bias transistor.

10. The processing circuit of claim 9, wherein when the image sensor apparatus operates under the global shutter mode, a reset charge signal at the first floating diffusion node is stored into the reset transfer capacitor when the first switch unit is closed, the second switch unit is open, and the third switch unit is closed.

11. The processing circuit of claim 9, wherein the reset charge signal stored by the reset transfer capacitor is transferred to the second floating diffusion node when the first switch unit is open, the second switch unit is open, and the third switch unit is closed.

12. The processing circuit of claim 9, wherein when the image sensor apparatus operates under the global shutter mode, an exposure charge signal at the first floating diffusion node is stored into the signal transfer capacitor when the first switch unit is closed, the second switch unit is closed, and the third switch unit is open.

13. The processing circuit of claim 12, wherein the exposure charge signal stored by the signal transfer capacitor is transferred to the second floating diffusion node when the first switch unit is open, the second switch unit is closed, and the third switch unit is open.

14. The processing circuit of claim 9, wherein the image sensor cell is coupled to the processing circuit via a stacked pixel level connection channel.

15. The processing circuit of claim 14, wherein when the image sensor apparatus operated under the global shutter mode and the bias transistor is turned on and become conductive, the bias transistor is used to clear or reset a voltage level in the stacked pixel level connection channel; and, when the image sensor apparatus operated under the global shutter mode and the bias transistor is turned off, at least one charge signal at the first floating diffusion node is transmitted via the stacked pixel level connection channel to the second floating diffusion node.

16. The image sensor apparatus of claim 1, wherein the second terminal of the specific row select transistor is disconnected from the bias transistor of the processing circuit.

* * * * *